United States Patent [19]
Paddock

[11] 3,940,596
[45] Feb. 24, 1976

[54] DYNAMIC LOGIC COUNTER
[75] Inventor: Richard Charles Paddock, Kingston, N.Y.
[73] Assignee: International Business Machines Corporation, Armonk, N.Y.
[22] Filed: Apr. 24, 1975
[21] Appl. No.: 571,144

Related U.S. Application Data
[63] Continuation of Ser. No. 369,022, June 11, 1973, abandoned.

[52] U.S. Cl..... 235/92 LG; 235/92 SH; 235/92 CC; 235/92 R; 307/220 R; 328/42
[51] Int. Cl.² ........................................ H03K 23/02
[58] Field of Search....... 235/92 LG, 92 SH, 92 CC, 235/92 GT; 307/220, 224; 328/42, 51

[56] References Cited
UNITED STATES PATENTS

| | | | |
|---|---|---|---|
| 3,354,295 | 11/1967 | Kulka | 235/92 CC |
| 3,387,118 | 6/1968 | Petzold | 235/92 GT |
| 3,511,977 | 5/1970 | Hornung | 235/92 CC |
| 3,569,678 | 3/1971 | Emde | 235/92 CC |
| 3,605,025 | 9/1971 | Lincoln et al. | 328/48 |

FOREIGN PATENTS OR APPLICATIONS
1,213,384  11/1970  United Kingdom

*Primary Examiner*—Joseph M. Thesz, Jr.
*Attorney, Agent, or Firm*—Karl O. Hesse

[57] ABSTRACT

Dynamic logic counting circuits are disclosed using recirculating latched memory stages having parallel shift circuits operating in synchronism with the latch circuits to control stepping of the counts. An alternate embodiment employs steering circuit controlled subcounters, each subcounter having a parallel shift circuit operating in synchronism with its respective subcounter to step the next succeeding subcounter when its respective subcounter reaches a predetermined count such as 9 for a binary coded decimal counter or 15 for a binary counter.

14 Claims, 7 Drawing Figures

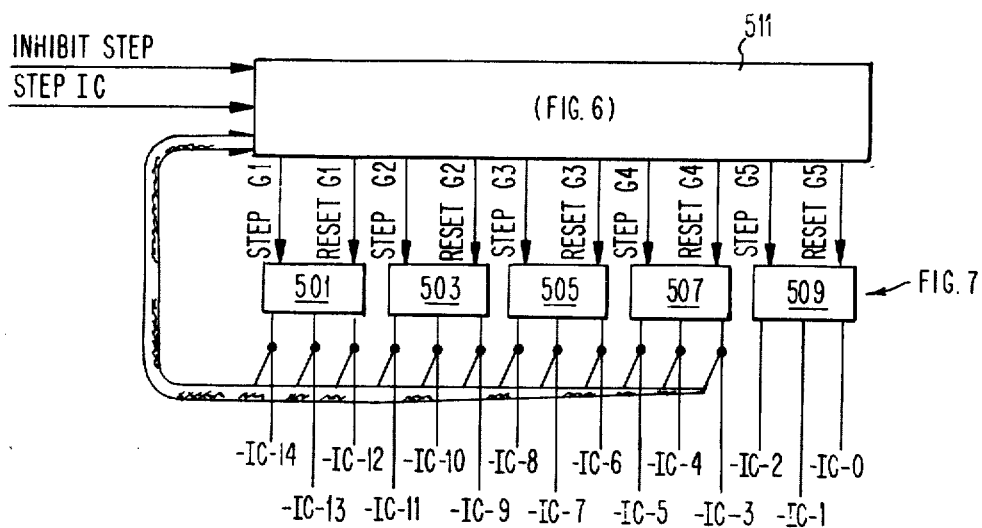
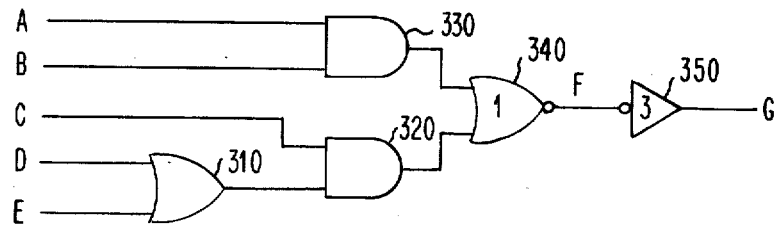
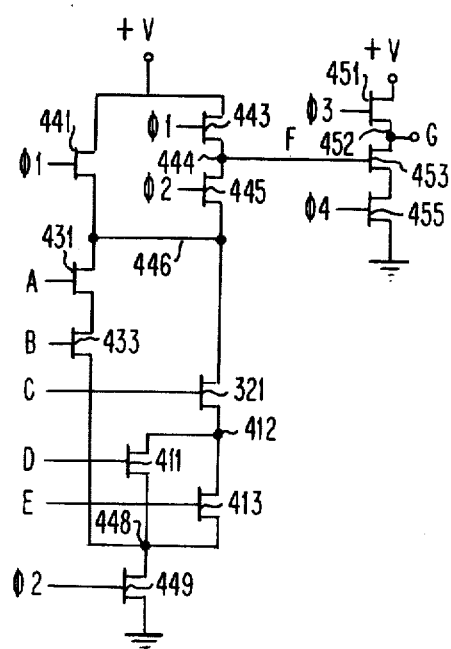

3,940,596

1

DYNAMIC LOGIC COUNTER

This is a continuation of application Ser. No. 369,022 filed June 11, 1973, now abandoned.

BACKGROUND OF THE INVENTION:

Digital counting circuits are most often implemented using flip-flop circuits connected in propagating daisy chain fashion so that whenever one stage switches from a logical 1 to a logical 0, the next following stage is activated to change state. Another common embodiment for a digital counting circuit is in the form of an adder which adds the amount by which the counter is to be advanced to the current count within the counter.

Neither of these well known counting circuit configurations lend themselves well to implementation using dynamic logic circuits because of the substantial time required within each dynamic logic gate to perform a decision. For this reason, daisy chain flip-flop counters operate at very low speed when implemented in dynamic logic. Although often capable of being operated faster than daisy chain counters, the adder implemented counters described above also are slower than is often desired and require substantially higher numbers of logic decisions circuits and, therefore, occupy much more integrated circuit chip area than is optimally desired.

A third dynamic logic counter known in the art includes a substantially complex steering logic circuit having inputs from all counting stages to allow parallel logical decisions to change the state of the proper counter stages thereby incrementing the counter to the next count. Because all logical decisions are made substantially in parallel and, therefore, substantially during the same time interval, a steering circuit controlled counter requires a very short time to increment. An example of such a third embodiment is U.S. Pat. No. 3,654,441. The steering circuit controlled counter, however, has the serious drawback of requiring complex logic circuits. In addition, counters having a large number of counting stages cannot be built because the maximum number of AND gate inputs or OR gate inputs specified for the dynamic logic circuit family being used, will quickly be exceeded when connecting the dynamic logic circuits to ensure that all logical decisions are made at the same time. The maximum number of inputs which can be connected to a logic circuit are, of course, determined by such considerations as series device impedance, device capacitance and so forth.

SUMMARY OF THE INVENTION

It is an object of this invention to increase the counting speed of a dynamic logic digital counter while at the same time keeping the number of dynamic logic circuits required to implement the counter to a minimum.

It is a still further object of this invention to make use of the inherent time delay required by a dynamic logic circuit to make a logical decision, in shift stages which propagate the signal for advancing the count within the counter, in synchronism with recirculation of the contents of each dynamic logic recirculating memory stage of the counter.

It is an even still further object of this invention to exploit the speed of steering circuit controlled counters while at the same time overcoming the disadvantages thereof by employing such counters as multistate memory stages or subcounters in combination with dynamic logic shift circuits for advancing the state or count of a next succeeding subcounter when the respective subcounter of the shift circuit reaches a predetermined state or count.

These and other objects which will become apparent upon a reading of the specification and drawings are obtained by employing dynamic logic shift circuits in synchronous and parallel operation with dynamic logic memory stages so as to propagate an advance signal to a next succeeding memory stage when the count of a respective memory stage associated with a shift circuit equals a predetermined value.

BRIEF DESCRIPTION OF THE DRAWINGS

FIG. 3 is an example logic block diagram of a logical AND/OR/INVERT circuit as used in the embodiments of FIGS. 1, 5, 6 and 7.

FIG. 4 is the detailed circuit schematic of a field effect transistor implementation of the logical block diagram of FIG. 3.

FIG. 5 shows a block diagram of an alternate embodiment of the invention.

EXAMPLE DYNAMIC LOGIC CIRCUITS

Figure 1:
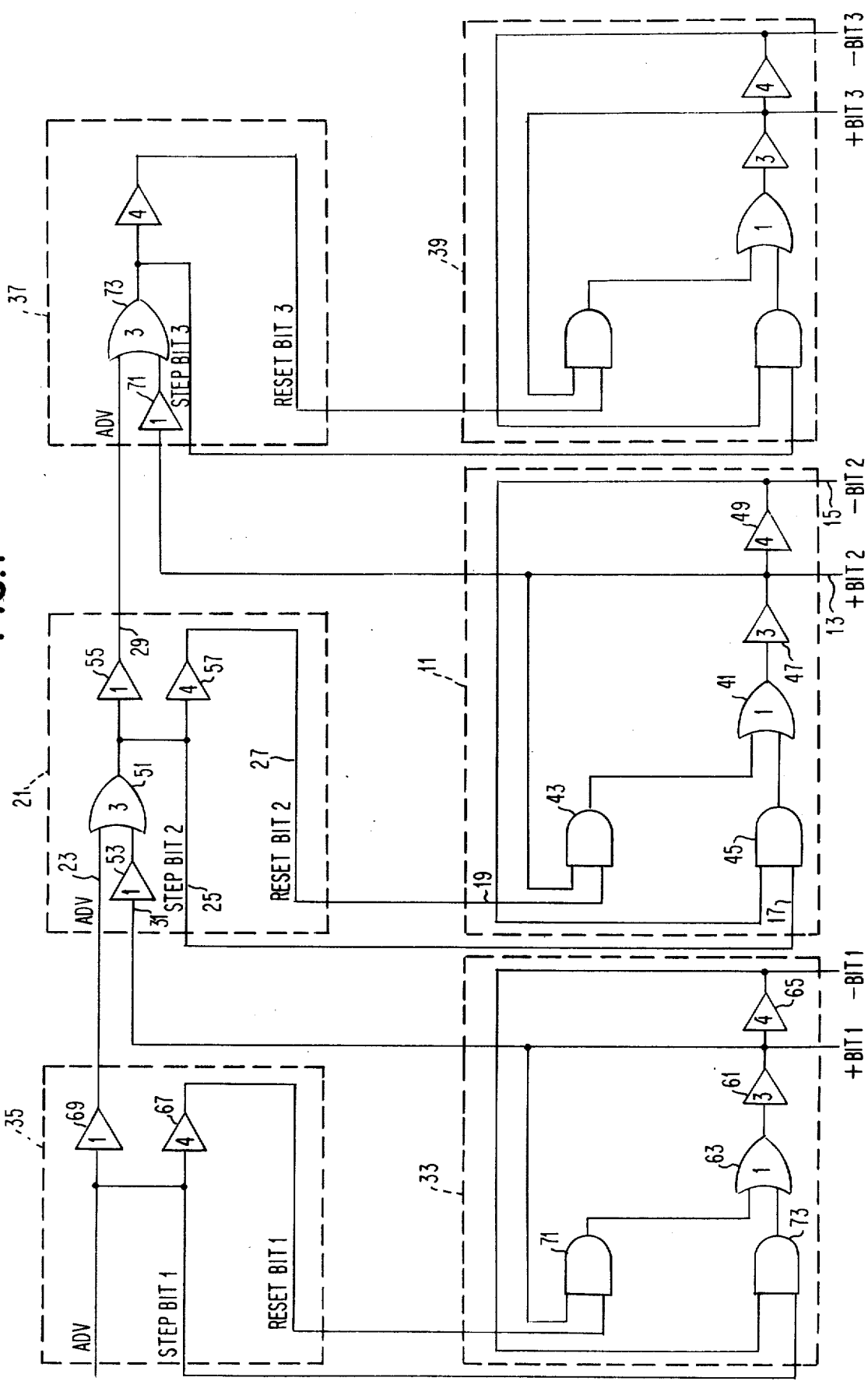
FIG. 1 shows the first three stages of a counter according to a preferred embodiment of the invention in logic block diagram form.

Inasmuch as the preferred embodiments of the instant invention have been implemented using dynamic field effect transistor logic, it is believed that a more clear understanding of the invention is facilitated by reference to FIG. 3 and 4 wherein example dynamic logic field effect transistor circuits are shown. These circuits per se do not constitute the invention; however, the use of their inherent delay characteristics when connected in the described inventive combinations do provide the advantages which are claimed for the instant invention. It will be recognized by those skilled in the art that various substitutes for the below described dynamic logic circuits can be selected in replacement thereof without departing from the teachings which follow later in this specification.

Each dynamic logic circuit includes a minimum of three field effect transistor devices, at least two of which are connected to different ones of four non-overlapping phase clock signals labeled 01, 02, 03 and 04. For example, inverter 350 of FIG. 3 as shown in FIG. 4 includes field effect transistor 451 having drain and source connected to positive voltage supply +V and node 452, respectively, and a gate connected to phase 3 clock. Transistor 451 precharges node 452 to a positive voltage level during each phase 3 time interval. Transistors 453 and 455 are connected in series between node 452 and ground reference potential as shown in FIG. 4. Thus if a positive voltage signal F appears at the gate of transistor 453, transistor 453 will be rendered conducting and will discharge node 452 to ground reference potential through transistor 455 during a phase 4 time decision interval during which time transistor 455 is rendered conducting. During the following phase 1 and 2 time intervals, a down level signal G will have been caused to appear at node 452 by the up level signal F which appeared at node 444 during the previous phase 4 time interval. In this manner inverter 350 both inverts and delays a signal as it passes therethrough.

In like manner, transistors 441 and 443 are connected drain-to-source between the positive voltage supply and nodes 446 and 444 respectively. Thus during phase 1 time interval nodes 446 and 444 are charged to a positive voltage level. Likewise, transistors 445 and 449 are connected drain-to-source between nodes 444 and 446 and 448 and ground reference potential, respectively, so that the charge at node 444 and 446 is conducted to ground reference voltage during phase 2 time decision interval if the transistors between node 446 and 448 are such as to provide a conductive path. The transistors between the nodes 446 and 448 comprise the logical AND circuits 320, and 330 and logical OR circuit 310. For example, if positive voltage signals A and B are applied to the gates of transistors 431 and 433, they will be rendered conductive and a path will be completed between node 446 and node 448 satisfying the AND function. Likewise, if a positive voltage signal C and either a positive voltage signal D or a positive voltage signal E is applied to transistors 321 and transistor 411 or transistor 413, respectively, a second path is provided from node 446 to node 448 thereby fulfilling the logical AND function of circuit 320 and the OR function of OR INVERT circuit 340. To the extent that either transistor 411 or transistor 413 can provide a conductive path between node 412 and node 448, the OR function of OR gate 310 is implemented. During the following phase 3 and phase 4 time intervals an up level signal F will have been generated if neither AND circuit 320 nor 330 connected to OR INVERT circuit 340 provided the above described conductive path between node 446 and node 448.

A PREFERRED EMBODIMENT OF THE INVENTION

Three stages of a binary counter implemented in accordance with the invention is shown in FIG. 1. The counter of FIG. 1 includes a plurality of dynamic logic recirculating memory stages taking the form of logical AND, OR, INVERT latch circuits 11, 33, and 39. The latch of each memory stage includes a true output labeled +BIT 1, +BIT 2 and +BIT 3. Likewise, each latch circuit includes an inverse output labeled —BIT 1, —BIT 2 and —BIT 3. The latch circuit of each memory stage also includes a recirculate inverse input for receiving a step signal and an inhibit recirculate true input for receiving a reset signal. For purposes of example, the true and inverse output of latch 11 are labeled 13 and 15, respectively, while the recirculate inverse and inhibit recirculate true inputs are labeled 17 and 19, respectively.

Each of the above described latches is made up of an inventory AND/OR gate or two INVERT circuits. For example, the latch of memory stage 11 includes an AND/OR gate comprising AND circuits 43 and 45 having outputs connected to the input of OR/INVERT circuit 41. The output of OR/INVERT circuit 41 is connected to an input of INVERT circuit 47. The output of INVERT circuit 47 is the true output of the latch 11 which is connected to an input of AND circuit 43 providing a gated positive feedback path thereby implementing the latch function. The output of INVERT circuit 47 is connected to an input of INVERT circuit 49, the output of which is the inverse output of the latch of memory stage 11. The output of INVERT circuit 49 is connected to an input of AND circuit 45 to provide an inverse feedback path for changing the state of the latch 11 when an active step signal is received at input 17 to condition AND circuit 45 and an active reset signal is received at input 19 to decondition AND circuit 43 thereby opening the positive feedback path while closing the negative feedback path.

Each of the aforementioned memory stages act to store the binary face value (a logical one or a logical zero) of a bit position having a place value such as 1, 2, 4, 8, etc., of a binary number in much the same manner as is known in the art. It is primarily in the area of incrementing the count stored within the above described memory stages that the invention departs from the teachings of the prior art.

In order to change the state of the proper memory stages so as to increment a count stored within the counter of FIG. 1, each memory stage has an associated shift stage. For example, the latch circuit 33 of bit position 1 has an associated shift stage 35, latch 11 has an associated shift stage 21, and latch 39 has an associated shift stage 37. Each shift stage has an advance input for receiving a signal to advance the counter. Again for purposes of example, the advance input to shift stage 21 is labeled 23. Each shift stage contains dynamic logic circuits for delaying the advance signal and, in the proper circumstances, for inhibiting the advance signal. When not inhibited, the delayed advance signal is provided to a step output such as output 25 for providing a recirculate inverse signal to its associated latch circuit to complete a feedback path from an inverse output of the latch circuit causing the latch to change state from a logical 1 to a logical 0 or from a logical 0 to a logical 1. The change of state of the latch circuit of a memory stage associated with a shift stage is completed by inhibiting the feedback path from the true output of the latch with a reset signal from an output such as output 27 of the shift stage.

In addition to changing the state of its associated memory stage, each shift stage propagates the advance signal received at its input to an output after delaying the advance signal by the time required for one recirculation of the dynamic logic latch circuit. In this manner the advance signal is propagated to the next following shift stage. Each shift stage, for example stage 21, also has an inhibit input such as inhibit 31 connected to the true output of the next preceding memory stage. The inhibit input to each shift stage inhibits the previously described step, reset, and delayed advance outputs from a shift stage whenever the preceding memory stage to which it is connected contains a logical zero before being stepped. In this manner, when the memory stage of a bit position is changed from a logical zero to a logical one by its respective shift stage, the propagated advance signal is inhibited from changing the state of following higher order bit position memory stages.

Referring again to FIG. 1, a detailed logic diagram is shown within the dotted line 21 representing the shift stage associated with latch 11. The previously described advance signal is connected to one input of a logical AND gate 51 while the previously described inhibit input 31 is connected to another input of AND gate 51 through an INVERT circuit 53. Thus whenever the inhibit input is not active, AND gate 51 is activated to generate the step signal at its output which is connected to output 25 as well as to the input of inverter circuits 55 and 57. The output of inverter circuit 57 is connected to output 27 to provide the reset signal while the output of INVERT circuit 55 is connected to output 29 to provide the delayed and propagated advance signal for use by a next following shift stage such as stage 37.

OPERATION OF THE PREFERRED EMBODIMENT

Figure 2:
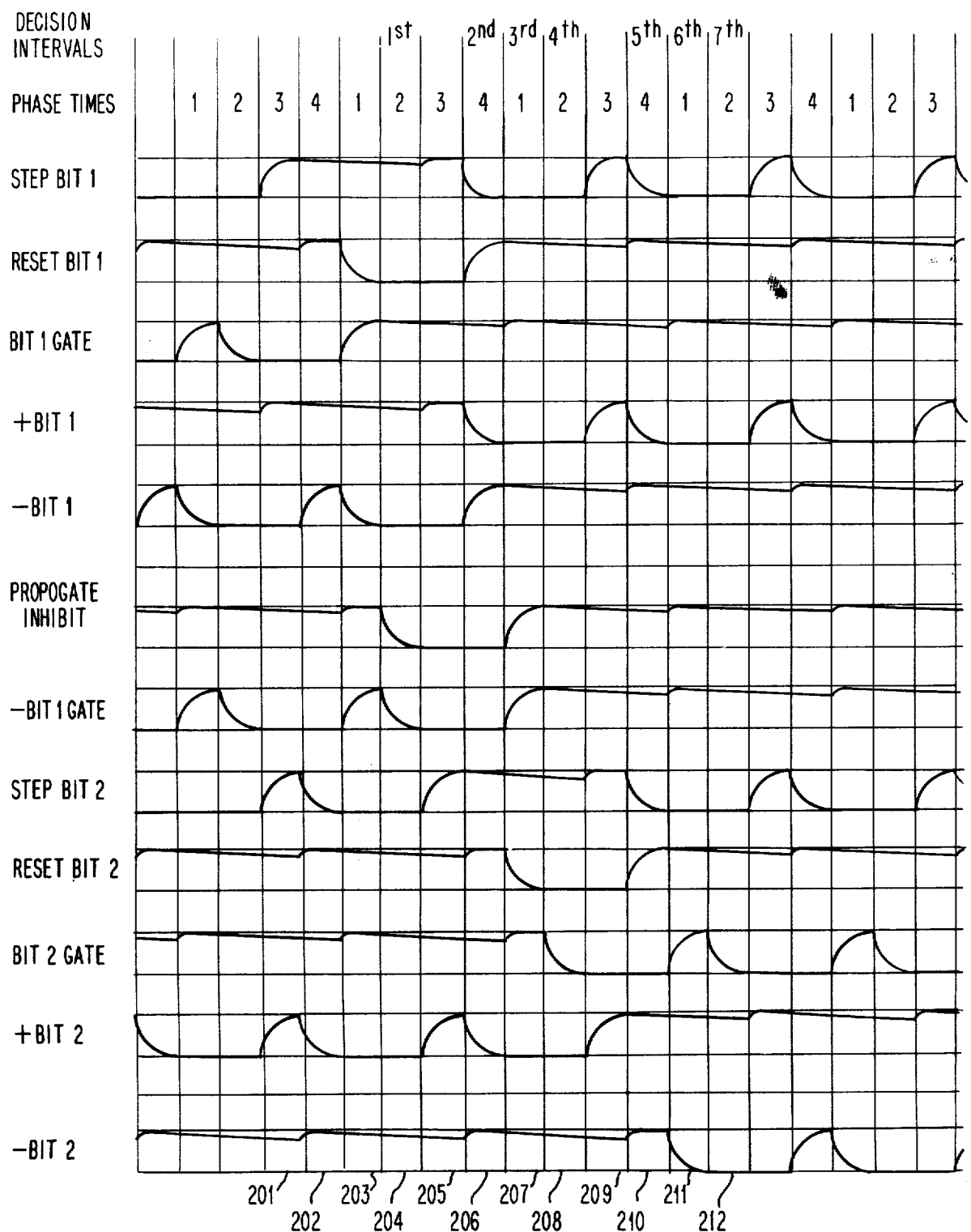
FIG. 2 includes time waveforms of pertinent circuit node voltages of the diagram of FIG. 1.

Referring now to FIG. 2, a step by step description of the operation of the counter of FIG. 1 will be set forth. For purposes of explanation, let it be assumed that the counter of FIG. 1 contains the binary number 100. Thus, bit position 1 contains a logical 1 while bit positions 2 and 3 contain logical zeros. As was previously described with respect to the example dynamic logic circuits of FIG. 3 and 4, each dynamic logic circuit acts during a repeating series of non-overlapping phase times 1 through 4. Referring to the waveform labeled +BIT 1 of FIG. 2, it can be seen that INVERTER 61 of FIG. 1 always charges +BIT 1 line to a positive voltage during phase 3 times. It is for this reason that the numeral 3 appears within the block diagram of inverter 61. Since it has been assumed that latch 33 is set to contain a logical 1, it follows that the output of inverter 61 is not discharged during phase 4 time decision interval 202 and, therefore, a positive level signal is available at the +BIT 1 output of latch 33 of FIG. 1 during the following phase 1 and 2 time intervals. Inasmuch as latch 11 has been assumed to contain a logical zero, the waveform +BIT 2 of FIG. 2 shows output +BIT 2 being charged to a positive voltage during each phase 3 time interval and being discharged to ground reference potential during phase 4 decision time intervals 202 and 206. Therefore, during the following phase 1 and phase 2 time intervals, +BIT 2 waveform is at the ground reference potential. Likewise, —BIT 1 and —BIT 2 waveforms of FIG. 2 are inverted from and delayed by a single phase time interval with respect to +BIT 1 and +BIT 2 waveforms, respectively. With the continued recirculation of logical ones and zeros within latches 33 and 11 as shown in FIG. 2 in mind, attention is directed to the STEP BIT 1 waveform of FIG. 2 which is an output from shift stage 35. Inasmuch as shift stage 35 is the first stage of the counter, the state of latch 33 must be changed every time an advance pulse is received. Therefore, no inhibit input or inhibit gate logic is needed and the advance input can be used directly as the STEP BIT 1 output so long as its decision interval occurs during phase 4 clock time. As a result of STEP BIT 1 waveform being at a positive voltage level during phase 1 time 203, the RESET BIT 1 output from inverter 67 of FIG. 1 is caused to go to a ground reference potential. Thus the STEP BIT 1 and RESET BIT 1 waveforms of FIG. 2 will be at a positive voltage and at ground reference potential, respectively, during phase 2 clock time 204 which is the first decision interval of importance with respect to the counter of FIG. 1.

The STEP BIT 1 waveform of FIG. 2 acts on AND circuit 73 to complete a feedback path from the inverse output —BIT 1 of the recirculating dynamic logic latch circuit 33 during phase 2 time decision interval 204. Likewise, the feedback path from the true output, +BIT 1, is inhibited during phase 2 time decision interval 204 at AND circuit 71 by RESET BIT 1 waveform being at ground reference potential. Therefore, the output of AND/OR gate 63 labeled BIT 1 GATE in FIG. 2 remains at a positive level during phase 3 and 4 time intervals 205 and 206, respectively, since neither AND circuit 71 nor AND circuit 73 provided a conductive path during phase 2 time decision interval 204. Latch 33 has thus begun to change state from a logical 1 to a logical 0.

Although latch 33 has begun to change state during a first decision time interval 204, its output signals +BIT 1 and —BIT 1 are still at positive and ground reference potentials, respectively. Therefore, during this same first decision time interval 204, INVERT circuit 53 of shift stage 21 is able to invert the positive potential true output from the first memory stage 33, providing a negative voltage potential to allow the advance signal to propagate through inverting OR gate 51 of shift stage 21. The advance signal is provided to shift stage 21 by INVERT circuit 69 during this same first decision time interval 204. As a result of INVERT circuit 53 and 69 having positive voltage level signals at their input during decision time interval 204, the outputs of INVERT circuit 53 and 69 will be at a negative ground reference potential during phase three clock time 205 and phase four clock time 206 as exemplified by the propagate INHIBIT waveform of FIG. 2.

The second decision interval of importance with respect to the counter of FIG. 1 is phase 4 clock time 206. It is during clock time 206 that the output of OR gate 51 is allowed to remain at a positive voltage level because neither of its inputs are at a positive voltage level, thereby generating STEP BIT 2 waveform as shown in FIG. 2. The STEP BIT 2 waveform in FIG. 2 is inverted by INVERT circuit 57 during the third decision time interval of importance, namely phase 1 clock time 207 to generate the waveform RESET BIT 2 of FIG. 2. Thus, with reference to FIG. 2, it can be seen that the STEP BIT 2 and the RESET BIT 2 waveforms are at a positive voltage level and a ground reference voltage level, respectively, during the fourth decision time of importance with respect to the counter of FIG. 1, namely phase 2 clock time 208. These waveforms are, therefore, in condition to complete a feedback path from the inverse output —BIT 2 output of stage 11 via AND gate 45 and to inhibit a feedback path from the true or +BIT 2 output via AND gate 43 during the fourth decision interval 208. Just as the binary 1 bit which has been assumed to have been stored in latch stage 33 was able to gate the propagated advance signal from shift stage 35 into shift stage 21 during the same first decision interval 204 as latch stage 33 was stepped from a binary 1 to contain a binary 0, so too does the binary 0 bit assumed to have been stored in latch stage 11 inhibit propagation of the advance signal into shift stage 37 during the same fourth decision interval 208 as latch stage 11 is stepped to contain a binary 1. The advance signal is propagated out of shift stage 21 via INVERT circuit 55 but is inhibited from changing the state of memory stage latch 39 by the positive voltage level signal provided by INVERT circuit 71 which causes the STEP BIT 3 line to be discharged to ground reference potential during the fifth decision interval 210.

Although latch stage 11 has started to change state during the fourth decision interval 208, it will not have completely changed state until the sixth and seventh decision intervals at which time the new +BIT 2 and —BIT 2 outputs become available as the new contents of latch 11 is recirculated. It can be seen that it takes approximately four clock phase times or one full clock cycle to change the state of each stage of the instant embodiment of the invention. Thus for the three stage counter shown, it takes 10 phase times or 2½ clock cycles to step the first two stages from 100 to 010. For a 14 stage counter it would take 14½ clock cycles of four phases each to change the state of all stages.

Although it takes more than one clock cycle of four phase times to completely step a plural stage counter, all stages need not have changed state before the counter can be stepped again. This is due to the propagation mechanism provided by the shift stages by which a counter of the present invention is stepped. So long as the lowest order stage has completely changed state, the counter can be advanced again. Thus a stepping rate of once per clock cycle is possible with a plural stage counter of any length. All outputs of such a plural stage counter will, of course, not be valid until the last advance pulse has propagated until it is inhibited by encountering a stage containing a binary 0 bit which is flipped to a binary 1 state.

AN ALTERNATE EMBODIMENT AND ITS OPERATION

An even faster dynamic logic counting circuit will now be described which utilizes the shift logic stage teachings of the preferred embodiment in combination with steering logic controlled subcounters. This alternate embodiment of the invention has the advantages of reduced complexity and the ability to implement counters having a virtually unlimited number of counting stages while at the same time exhibiting an increase in speed of operation over the counter of the preferred embodiment.

Merely for purposes of example, it is envisioned that this alternate embodiment be an instruction counter as might be used in any of a number of digital computers using dynamic logic circuits. Thus the signal STEP IC is synonymous with "advance instruction counter". Likewise the signal INHIBIT STEP is included in this specification to give a flavor of how a counter of the invention might be actually used in conjunction with other dynamic logic wherein decisions are often made only to be inhibited at a last available decision interval. The technique of making a decisison and later inhibiting the decision is especially useful in dynamic logic because dynamic logic is inherently slower than other forms of digital logic.

Figure 7:
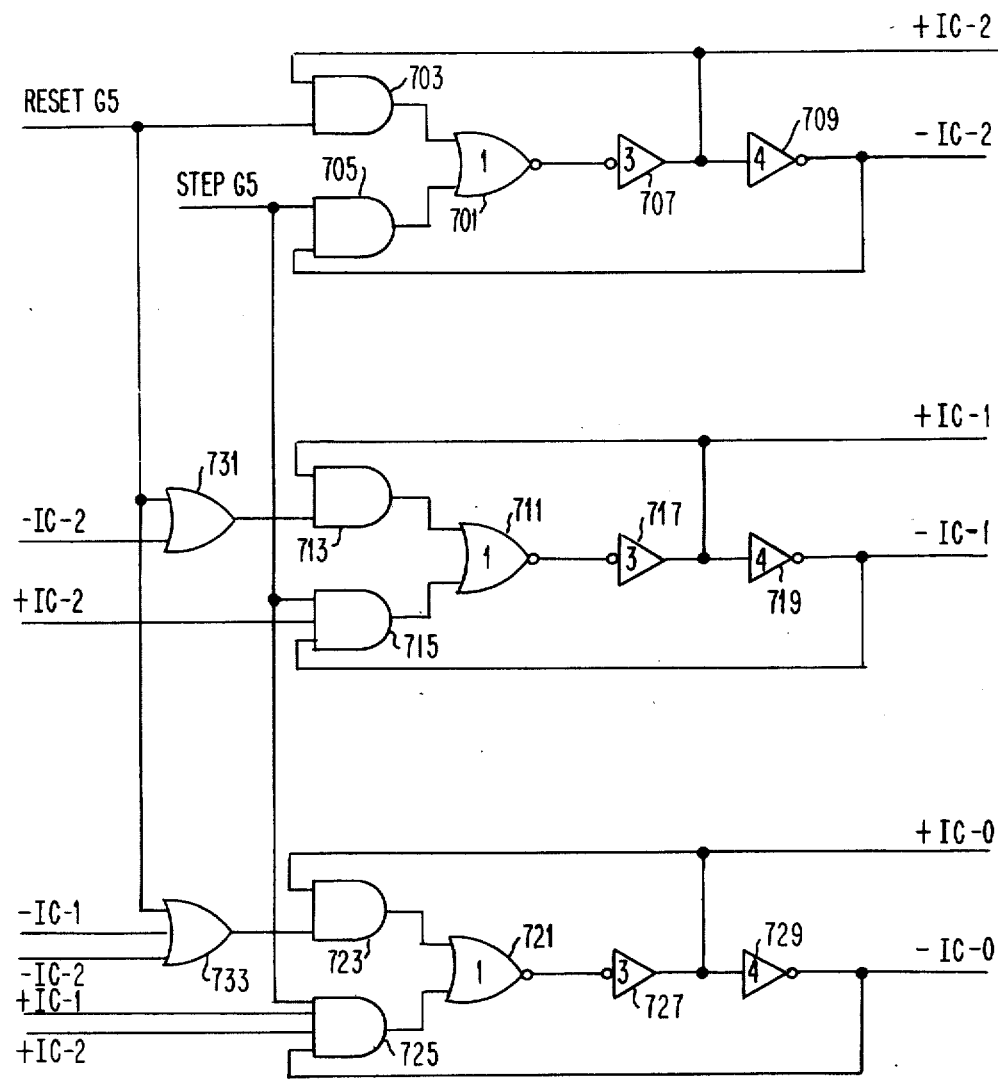
FIG. 7 is a logical block diagram of a three stage subcounter, five of which subcounters are incorporated into FIG. 5.

Referring briefly to FIG. 5, a plurality of three stage steering circuit controlled subcounters 501 through 509 are shown having inverse outputs labeled –IC-14 through –IC-0 from lowest order to highest order respectively. As an example, the three stage steering circuit controlled subcounter 509 is shown in FIG. 7. FIG. 5 includes five such subcounters. The only differences between the subcounters 501 through 509 are the clock phase times during which their dynamic logic circuits make logical decisions. Thus the inverting AND/OR gates 701, 711, and 721 of FIG. 7 make logical decisions during a phase 2 clock time. Reference is made to FIGS. 3 and 4 along with their foregoing description to show that gates 713, 715 and 731 operate in conjunction with and are a part of inverting gate 711 and, therefore, all will make logical decisions during a phase 2 clock time. The same reference applies to gates 703, 705 and 723, 725, 733 which are associated with and a part of inverting AND/OR gates 701 and 721, respectively.

Likewise INVERT circuits 707, 717, and 727 make logical decisions during a phase 4 clock time and INVERT circuits 709, 719 and 729 make logical decisions during a phase 1 clock time. The dynamic logic circuits of both subcounters 501 and 509 make logical decisions during the clock phase times indicated in FIG. 7. For purposes of easier explanation, the phase 2 clock time during which the inverting AND/OR gates of subcounter 501 make logical decisions is later referred to as clock 2 phase 2, or a fourth decision time. Likewise, the phase 2 clock time during which the inverting AND/OR gates of subcounter 509 make logical decisions is later referred to as clock 3 phase 2 or an eighth decision time.

With further reference to FIG. 7, the inverting AND/OR gates of subcounter 503 will make their logical decisions during a fifth decision time, namely clock 2 phase 3 time. The inverting AND/OR gates of subcounter 505 will make their logical decisions during the sixth decision time clock 2 phase 4 and the inverting AND/OR gates of subcounter 507 will make their logical decisions during the seventh decision time clock 3 phase 1. Just as INVERT circuits 707 and 709 of counter 509 made their logical decisions two and three phase times after the decision time of inverting AND/OR gate 701, respectively, so the decision times of the INVERT circuits of counters 501 through 507 are delayed from their inverting AND/OR gate decision times to accomplish recirculating latched memory stage operation. With the knowledge of one of ordinary skill of the art of dynamic logic circuits and the foregoing description in mind, it becomes merely repetitive to further recite details of the subcounters 501 through 509 except to note that the steering circuits referred to earlier herein take the form of OR gates 731 and 733, and AND gates 715 and 725 connected as shown in FIG. 7.

Figure 6:
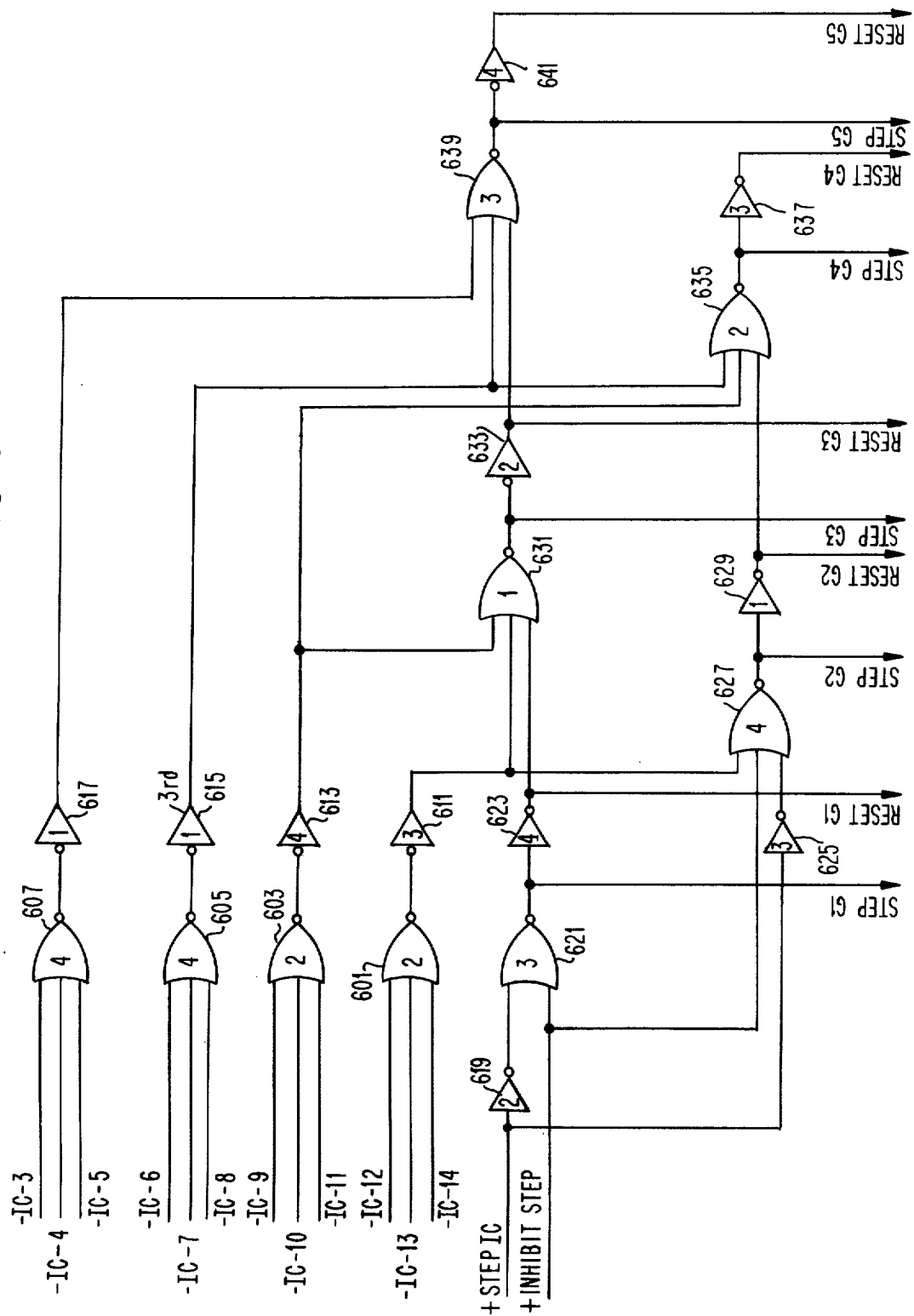
FIG. 6 is a logical block diagram of the shift circuits of FIG. 5.

In order to sample the contents of a first subcounter 501 during a first time interval, attention is drawn to FIG. 6 wherein shift logic 503 of FIG. 5 is shown in more detailed schematic form. Referring then to FIG. 6, sampling gates in the form of dynamic logic inverting OR gates 601 through 607 are provided. Each of gate 601 through 607 has three inputs which are connected to the three inverse outputs of each of the lower order four subcounters 501 through 507. Thus the inputs of OR gates 601 are connected to –IC-12, –IC-13, and –IC-14 outputs of subcounter 501. Thus when subcounter 501 contains a predetermined binary count of seven, –IC-12 through –IC-14 being the inverse outputs of subcounter 501 are all at a logical 0 state or, in other words, at ground reference potential. Thus no input is available to OR gate 601 to discharge its output node during a first time interval, more explicitly identified as clock 1 phase 3, and therefore a ground reference potential inhibit propagate signal is generated at the output of INVERT circuit 611 during the third and fourth time intervals, i.e. clock 2 phases 1 and 2 allowing propagation of an advance signal. Sampling gates 603 through 607 and their respective inverters 613 through 617 are connected in a corresponding manner as shown in FIG. 6 to one another and to counters 503 through 507 of FIG. 5.

In order to increment the first subcounter 501 in response to an advance signal labeled +STEP IC, an inverting OR gate 621 and an INVERT circuit 623 are provided. The output of OR gate 621 is labeled STEP G1 and corresponds to the signal line of the same name shown in FIG. 5. The output of OR gate 621 is also connected to the input of INVERT circuit 623, the output of which is the RESET G1 signal also shown in FIG. 5.

In order to further improve the operating speed of this alternate embodiment of the invention, the advance signal is propagated through shift logic 511 in two parallel paths, each including dynamic logic inverting OR gates and INVERT circuits to control increasingly higher order subcounter stages 501 through 509 in a sequential propagating manner.

The +STEP IC advance signal is received at the inputs to inverters 619 and 625. Inverters 619 and 625 provide proper timing relationships so that the advance signal will be able to control gate 621 during a second time interval clock 1 phase 4 and gate 627 during a third time interval clock 2 phase 1. To this end, the output of INVERT circuits 619 and 625 are of course connected to inputs of inverting OR gates 621 and 627.

The output of inverting OR gate 621 is connected to the input of INVERT circuit 641 at the extreme left of FIG. 6, serially through INVERT circuit 623, inverting OR gate 631, INVERT circuit 633, and inverting OR gate 639 to control subcounters 501, 505, and 509 during fourth, sixth and eighth time intervals, respectively. These intervals correspond to clock 2 phase 2, clock 2 phase 4 and clock 3 phase 2. Likewise, the output of INVERT circuit 625 is connected to the input of INVERT circuit 637 serially through inverting OR gate 627, INVERT circuit 629, and inverting OR gate 635 to control subcounters 503 and 507 during the fifth and seventh time intervals, corresponding to clock 2 phase 3 and clock 3 phase 1, respectively.

OPERATION OF THE ALTERNATE EMBODIMENT

The following description of the operation of the counter of FIGS. 5, 6, and 7 is presented in a tabular paragraph form. Each paragraph is keyed to a sequential decision time and recites the logical decisions made by some of the more important decision blocks of the counting circuit. For the purposes of this description it is assumed that the counter contains the binary count of 000001111111111 in stages IC-0 through IC-14, respectively, and that a single STEP IC advance signal will be received to advance the counter. Only subcounters 501, 503, 505, and 507 will, therefore, be required to change state.

First Decision Time — Clock 1 Phase 3

Gates 601 and 603 sample the contents of subcounters 501 and 503 finding the predetermined count of a binary seven in each subcounter as was the assumption for this example.

Subcounter 503 inverting AND/OR gates make logical decisions to recirculate true.

Second Decision Time — Clock 1 Phase 4

Gate 621 in response to an advance signal +STEP IC makes a logical decision to step subcounter 501 during the fourth decision time if +INHIBIT STEP signal is not present.

INVERT circuit 611 makes the logical decision to provide a ground reference output signal during third and fourth decision times thereby not inhibiting advance signal propagation.

INVERT circuits 707, 717, and 727 of subcounters 501 and 509 make logical decisions to generate the true outputs of their respective latches during third and fourth decision times, i.e. not to discharge nodes +IC-14, +IC-13, and +IC-12 to ground reference potential but to discharge +IC-2, +IC-1 and +IC-0.

INVERT circuits 709, 719, and 729 of subcounter 507 make logical decisions to generate the inverse outputs of their respective latches during third and fourth decision times, i.e. to discharge node −IC-5 but not to discharge nodes −IC-4 and −IC-3 to ground reference potential.

Third Decision Time — Clock 2 Phase 1

Gates 605 and 607 sample subcounters 505 and 507, respectively, finding the predetermined count of seven in subcounter 505 but a count less than seven in subcounter 507.

INVERT circuit 613 makes the logical decision to provide a ground reference potential output during fourth and fifth decision times thereby not inhibiting advance signal propagation.

INVERT circuit 623 makes the logical decision to provide a ground reference output during the fourth decision time in order to inhibit recirculation of true outputs of each latch of counter 501 and to propagate the advance signal.

Inverting OR gate 627 makes the logical decision to provide a positive voltage output during fourth and fifth decision times to step counter 503 by recirculating the inverse output of each latch during the fifth decision time.

Fourth Decision Time — Clock 2 Phase 2

Subcounter 501 increments from a count of seven to a count of zero, by all of its latches recirculating their inverse outputs.

The advance signal is propagated through gate 631 which makes the logical decision to provide a positive voltage output during fifth and sixth decision times to step subcounter 505 during the sixth decision time.

INVERT circuits 615 and 617 make logical decisions to provide ground reference and positive voltage outputs, respectively, during fifth and sixth decision times to not inhibit gate 635 but to inhibit gate 639 thereby preventing propagation of the advance signal through gate 639.

Fifth Decision Time — Clock 2 Phase 3

Subcounter 503 increments from a count of seven to a count of zero, all of its latches recirculating their inverse outputs.

The advance signal propagates through gate 635 which makes the logical decision to provide a positive voltage output during sixth and seventh decision times to step subcounter 507 during the seventh decision time.

INVERT circuits 709, 719, and 729 of subcounter 505 make logical decisions to generate the inverse outputs −IC-8, −IC-7, and −IC-6 during sixth and seventh decision times by discharging their outputs to ground reference potential.

INVERT circuits 707, 717, and 727 of subcounter 507 make logical decisions to generate the true outputs +IC-5, +IC-4, and +IC-3 during sixth and seventh decision times by not discharging the output of circuit 707 but discharging the outputs of circuits 717 and 727.

Sixth Decision Time — Clock 2 Phase 4

Subcounter 505 increments from a count of seven to a count of zero.

The advance signal is inhibited from propagating through gate 639 by the output of INVERT circuit 617 as a result of sampling gate 607 having found subcounter 507 to contain a count of less than seven.

INVERT circuits 709, 719, and 729 of subcounter 507 make logical decisions to generate the inverse outputs −IC-5, −IC-4, and −IC-3 during seventh and eighth decision times by discharging the output of circuit 709, but not discharging the outputs of circuits 719 and 729.

INVERT circuits 707, 717, and 727 of subcounters 501 and 509 make logical decisions to generate the true outputs +IC-14, +IC-13, and +IC-12, and +IC-2, +IC-1, and +IC-0 during seventh and eighth decision times. Since subcounter 501 was stepped to zero during the fourth decision time, circuits 707, 717, and 727 of both subcounters will all discharge their outputs to ground reference potential.

Note that gate 621 has been precharged and could accept a second advance signal at this decision time thereby stepping the counter of FIG. 5 at the rate of once each clock cycle without causing interference with previous advance pulses being presently propagated to higher order subcounters.

Seventh Decision Time — Clock 3 Phase 1

Subcounter 507 increments from a binary count of one to a count of two at its outputs +IC-5, +IC-4, and +IC-3, respectively. This increment is accomplished by recirculating the inverse output −IC-5 through AND circuit 705 while inhibiting recirculation of true output +IC-5 through AND circuit 703. Likewise the inverse output −IC-4 being at a logical one positive voltage level is gated through AND circuit 715 by virtue of the fact that both +IC-5 and STEP G4 signals are also at a positive voltage level. Since neither −IC-5 nor RESET G4 signals are at positive voltage levels OR circuit 731 does not provide a conductive series path with AND circuit 713. Therefore, the true output +IC-4 is inhibited from recirculating. To aid in comprehending the foregoing sentences, reference is again made to FIGS. 3 and 4 and supporting description appearing herein under the heading of Example Dynamic Logic Circuits. Note that steering circuits 725 and 733 prevent inverting AND/OR gate 721 from recirculating inverse output −IC-3 and, therefore, the latch of this highest order stage of subcounter 507 does not change state.

INVERT circuits 709, 719, and 729 of subcounters 501 and 509 make logical decisions to generate positive voltage outputs −IC-14, −IC-13, −IC-12, and −IC-2, −IC-1, −IC-0, respectively, during eighth and ninth decision times.

Likewise INVERT circuits 707, 717, and 727 of subcounter 503 make logical decisions to generate ground reference potential outputs +IC-11, +IC-10 and +IC-9, respectively, during eighth and ninth decision times since subcounter 503 has been stepped to zero.

Eighth Decision Time — Clock 3 Phase 2

Subcounter 509 does not increment because the advance signal was not propagated through gate 639.

The INVERT circuits 707, 717, and 727 of subcounter 505 discharge their outputs +IC-8, +IC-7, and +IC-6 to ground reference making the new count of zero in subcounter 505 available at outputs for the first time during the ninth decision time.

INVERT circuits 709, 719, and 729 of subcounter 503 do not discharge their outputs −IC-11, −IC-10, and −IC-9 thereby making the inverse of the new count of zero in subcounter 503 available for the first time during the ninth decision time.

Ninth Decision Time — Clock 3 Phase 3

The INVERT circuits 707, 727, and 717 of subcounter 507 are now discharging outputs +IC-5, +IC-3 and not discharging +IC-4, respectively, to provide true outputs of subcounter 507 during 10 and 11 decision times.

10th Decision Time — Clock 3 Phase 4

The INVERT circuits 707, 717, and 727 are now discharging outputs +IC-2, +IC-1 and +IC-0 of subcounter 509, respectively, to provide true outputs of subcounter 509 during 11th and 12th decision times.

The foregoing description of an example operation of the alternate embodiment makes it apparent that the counter of FIG. 5 can be completely incremented from advance signal to appearance of outputs of highest order subcounter within 2 ½ clock cycles of four phases each.

It will be apparent to those of skill in the art of dynamic logic design that the teaching of the preferred embodiment showing shift stages connected in a single serial path can be applied to the subcounter teachings of the alternate embodiment to yield a counter capable of operating at a speed between that attainable by the preferred and alternate embodiments. Likewise, it will be apparent to such aforementioned one of skill in the art to increase the number of parallel paths comprising serially connected shift stages to obtain even further increases in speed than expressly set forth with respect to the alternate embodiment without departing from the spirit and scope of this invention. Such aforementioned one need merely follow the teachings as portrayed in FIGS. 6 and 7 being cognizant of the maximum number of inputs which can be provided to dynamic logic AND circuits and OR circuits in view of switching device impedance and capacitance. For example, three advance signal propagation paths operating to increment binary coded decimal subcounters, each having four latch memory stages, can easily be implemented according to the foregoing teachings in combination with well known binary coded decimal number system art.

It will be understood by those of skill in the art that the foregoing and other changes in form and details may be made to the preferred and alternate embodiments expressly described herein without departing from the spirit and scope of the invention.

What is claimed is:

1. A counter comprising:
 a plurality of dynamic logic circuit steering circuit controlled subcounters;
 shift logic means having an advance input for receiving an advance signal to advance said counter, said shift logic further comprising:
 first sampling logic having inputs connected to outputs of a first of said subcounters for sampling the contents thereof before the outputs of said first subcounter have changed state;
 first incrementing logic having an input for receiving said advance signal and an output connected to an input of said first subcounter, said first incrementing logic being synchronized with dynamic logic memory stages of said first subcounter to increment said first subcounter in response to receipt of said advance signal and to propagate said advance signal;

second incrementing logic having an input for receiving said advance signal, an input connected to the output of said first sampling logic and an output connected to an input of a second of said subcounters, said second incrementing logic being synchronized with dynamic logic memory stages of said second subcounter to increment said second subcounter and to propagate said advance signal if said sampled contents of said first subcounter equal a predetermined count.

2. The counter of claim 1 wherein said first and second incrementing logic means receives said advance signal from said advance input of said shift logic means and said shift logic means further comprises:

third incrementing logic having an input connected to an output of said first incrementing logic for receiving said advance signal therefrom, said third incrementing logic being synchronized with dynamic logic memory stages of a third of said subcounters to increment said third subcounter;

second sampling logic having inputs connected to outputs of said second subcounter for sampling the contents thereof before the outputs thereof have changed state, an output of said second sampling logic being connected to an input of said third incrementing logic to inhibit incrementing of said third subcounter if said sampled contents of said second subcounter do not equal said predetermined count.

3. A counter comprising:

a plurality of dynamic logic steering circuit controlled counters;

shift logic means having an advance input for receiving an advance signal to advance said counter, said shift logic further comprising:

first sampling logic having inputs connected to outputs of a first of said subcounters for sampling the contents thereof during a first decision time;

first incrementing logic having an input connected to said advance input of said shift logic, and an output connected to an input of said first subcounter, said first incrementing logic making a logical decision during a second decision time to step said first subcounter and to propagate said advance signal during a fourth decision time;

second incrementing logic having an input connected to said advance input of said shift logic for receiving said advance signal, an input connected to the output of said first sampling logic to inhibit incrementing higher order subcounters if the sampled contents of said second subcounter do not equal a predetermined count, and an output connected to an input of a second of said subcounters, said second incrementing logic making a logical decision during a third decision time to increment said second subcounter and propagate said advance signal during a fifth decision time if said sampled contents of said first subcounter do equal said predetermined count.

4. The counter of claim 3 wherein said shift logic further comprises second sampling logic having inputs connected to outputs of said second subcounter for sampling the contents thereof before the outputs thereof have changed state in response to an output from said second incrementing means;

third incrementing logic having an input connected to an output of said first incrementing logic for receiving said advance signal therefrom, and an input connected to an output of said second sampling logic to inhibit incrementing of higher order subcounters if said sampled contents of said second subcounter does not equal a predetermined count, an output of said third incrementing logic being connected to an input of a third of said subcounters, said third incrementing logic making a logical decision during a fourth decision time to increment said third subcounter and to propagate said advance signal during a fifth decision time if said sampled contents of said second subcounter do equal said predetermined count.

5. The counter of claim 4 wherein said shift logic further comprises third sampling logic having inputs connected to outputs of said third subcounter for sampling the contents thereof before the outputs thereof have changed state in response to a signal from said third incrementing logic;

fourth incrementing logic having an input connected to an output of said second incrementing logic for receiving said advance signal therefrom, an input connected to an output of said third sampling logic to inhibit incrementing of higher order subcounters if the sampled contents of said third subcounter do not equal said predetermined count, said fourth incrementing logic having an output connected to an input of said fourth subcounter, said fourth incrementing logic making a logical decision during a fifth decision time to increment said fourth subcounter during a seventh decision time if said sampled contents of said third subcounter do equal said predetermined count.

6. A counter comprising:

a dynamic logic recirculating memory stage for recirculation of a count stored therein, said memory stage having a true output, and a recirculate inverse input;

a dynamic logic shift stage having an advance input for receiving an advance signal to advance said counter, said shift stage propagating said advance signal in synchronism with said recirculation of said memory stage;

said shift stage further having a step output connected to said recirculate inverse input of said memory stage;

said shift stage further having a delayed advance output for connection to said advance input of a next following shift stage, and an inhibit input for connection to said true output on a next preceding memory stage for inhibiting said advance signal, thereby inhibiting signals from said step output and from said delayed advance output of said shift stage whenever said preceding memory stage contains a logical zero before being stepped.

7. The counter of claim 6 wherein each of said memory stages further comprise an inhibit recirculate true input; and wherein each of said shift stages further comprise a reset output connected to said inhibit recirculate true input of said memory stage.

8. The counter of claim 7 wherein each of said memory stages further comprise:

a logical AND/OR gate for making logical decisions at a first time interval, said AND/OR gate having a first AND circuit for recirculating the true output, said first AND circuit having an input for receiving said reset output signal from said shift stage, said AND/OR gate having a second AND circuit for recirculating said inverse output, said second AND circuit having an input for receiving said step output signal from said shift stage, a first logical INVERT circuit capable of making logical decisions at a second time interval having an input connected to the output of said AND/OR gate, an output of said first INVERT circuit being said true output;

a second logical INVERT circuit capable of making logical decisions at a third time interval having an input connected to said output of said first INVERT circuit, an output of said second INVERT circuit being an inverse output.

9. The counter of claim 7 wherein each of said shift stages further comprises:

a logical AND gate capable of making logical decisions at said second time interval, said AND gate having a first input for receiving said advance signal;

a first logical INVERT circuit capable of making a logical decision at said first time interval having an input connected to said inhibit input and an output connected to a second input of said logical AND gate for synchronizing said inhibit input with said advance signal;

said logical AND gate having an output connected to said step output and to an input of second and third logical INVERT circuits capable of making logical decisions at said first and said third time invervals, respectively;

said second logical INVERT circuit having an output connected to said delayed advance output and said third logical INVERT circuit having an output connected to said reset output.

10. The method of counting in the binary number system characterized by the arrangement of digits in sequence wherein successive digits are coefficients of successive powers of two comprising the steps of:

completing an inverse feedback path associated with a first recirculating dynamic logic memory stage in response to an advance signal during a first clock cycle to begin changing the state of said first memory stage;

propagating said advance signal as a delayed advance signal during said first clock cycle to a second recirculating dynamic logic memory stage for completing an inverse feedback path associated with said second memory stage; and inverting a true output from said first memory stage during said first clock cycle to generate a propagate inhibit signal for inhibiting said delayed advance signal from completing said inverse feedback path associated with said second memory stage if said first memory stage contains a logical zero during said first clock cycle;

completing an inverse feedback path associated with said second memory stage in response to said delayed advance signal during a second clock cycle to begin changing the state of said second memory stage if said first memory stage contains a logical one during said first clock cycle;

propagating said delayed advance signal as a further delayed advance signal during said second clock cycle; and inverting a true output from said second memory stage during said second clock cycle to generate a propagate inhibit signal for inhibiting said further delayed advance signal if said second memory stage contains a logical zero during said second clock cycle.

11. The method of claim 10 further comprising the step of:

inhibiting a true feedback path associated with said first memory stage during said first clock cycle in response to said advance signal.

12. The method of claim 11 further comprising the step of:

inhibiting a true feedback path associated with said second memory stage during said second clock cycle if said first memory stage contains a logical one during said first clock cycle.

13. The method of claim 12 wherein said first clock cycle steps are all accomplished during a first decision interval which is only a portion of said first clock cycle; and wherein said second clock cycle steps are accomplished during a fourth decision interval which is only a portion of said second clock cycle.

14. The method of counting utilizing a plurality of steering circuit controlled dynamic logic subcounters comprising the steps of:

sampling the contents of a first subcounter with a dynamic logic gate;

completing an inverse feedback path associated with a recirculating dynamic logic memory stage of said first subcounter in response to an advance signal during one decision time to begin changing the state of said first subcounter;

propagating said advance signal to a second subcounter as a delayed advance signal during said one decision time for incrementing said second subcounter;

inverting the output of said gate to provide an inhibit propagate signal during said one decision time for inhibiting said delayed advance signal from incrementing said second subcounter if said sampled contents of said first subcounter did not equal a predetermined count, sampling the contents of said second subcounter with a second dynamic logic gate;

completing an inverse feedback path associated with a recirculating dynamic logic memory stage of said second subcounter during a next decision time in response to said delayed advance signal if the contents of said first subcounter did equal said predetermined count;

propagating said delayed advance signal as a further delayed advance signal during said next decision time;

inverting the output of said second gate to provide a second inhibit propagate signal during said next decision time.

* * * * *